United States Patent
Reichenbach et al.

(10) Patent No.: US 10,017,375 B2
(45) Date of Patent: Jul. 10, 2018

(54) STRUCTURES FOR REDUCING AND PREVENTING STRESS AND TENSIONS DURING PROCESSING OF SILICON WITH THE AID OF MELTING BY A LASER

(71) Applicant: Robert Bosch GmbH, Stuttgart (DE)

(72) Inventors: Frank Reichenbach, Wannweil (DE); Till Schade, Kempten (DE); Jochen Reinmuth, Reutlingen (DE); Philip Kappe, Hildesheim (DE); Alexander Ilin, Ludwigsburg (DE); Mawuli Ametowobla, Stuttgart (DE); Julia Amthor, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/291,142

(22) Filed: Oct. 12, 2016

(65) Prior Publication Data
US 2017/0113919 A1    Apr. 27, 2017

(30) Foreign Application Priority Data
Oct. 26, 2015    (DE) .................. 10 2015 220 893

(51) Int. Cl.
*H01L 21/76* (2006.01)
*B81B 7/00* (2006.01)
*B81C 1/00* (2006.01)

(52) U.S. Cl.
CPC ........ *B81B 7/0035* (2013.01); *B81C 1/00182* (2013.01); *B81C 1/00293* (2013.01);
(Continued)

(58) Field of Classification Search
CPC ..... H01L 2924/0002; H01L 2924/1461; H01L 23/26; H01L 23/315; H01L 2924/16152;
(Continued)

(56) References Cited

U.S. PATENT DOCUMENTS

2007/0048888 A1* 3/2007 Christenson .......... B81B 7/0006 438/48
2009/0174148 A1* 7/2009 Bischof ............... B81C 1/00293 277/316
(Continued)

FOREIGN PATENT DOCUMENTS

WO    2015/120939 A1    8/2015

*Primary Examiner* — David Chen
(74) *Attorney, Agent, or Firm* — Norton Rose Fulbright US LLP; Gerard Messina

(57) ABSTRACT

A method is provided for manufacturing a micromechanical component including a substrate and a cap connected to the substrate and together with the substrate enclosing a first cavity, a first pressure prevailing and a first gas mixture with a first chemical composition being enclosed in the first cavity. An access opening, connecting the first cavity to surroundings of the micromechanical component, is formed in the substrate or in the cap. The first pressure and/or the first chemical composition are adjusted in the first cavity. The access opening is sealed by introducing energy and heat into an absorbing part of the substrate or the cap with the aid of a laser. A recess is formed in a surface of the substrate or of the cap facing away from the first cavity in the area of the access opening for reducing local stresses occurring at a sealed access opening.

7 Claims, 5 Drawing Sheets

(52) U.S. Cl.
CPC .. *B81C 1/00666* (2013.01); *B81B 2201/0235* (2013.01); *B81C 1/00277* (2013.01); *B81C 1/00325* (2013.01); *B81C 2201/0132* (2013.01); *B81C 2201/0143* (2013.01); *B81C 2203/0109* (2013.01); *B81C 2203/0145* (2013.01)

(58) Field of Classification Search
CPC ........ B81C 2203/0145; B81C 1/00293; B81C 2203/019; B81C 2203/0109; B81C 1/00325; B81C 1/00277; B81C 1/00285; B81B 2203/0315; B81B 7/0041; B81B 7/0048; B81B 3/0072; B81B 7/0035; E06B 3/6775
USPC ..... 257/415, 704, E29.324; 438/50, 51, 124, 438/126, 422, 456
See application file for complete search history.

(56) References Cited

U.S. PATENT DOCUMENTS

| | | | | |
|---|---|---|---|---|
| 2011/0114840 A1* | 5/2011 | Yamazaki | ................. | G01J 5/04 250/338.1 |
| 2014/0008738 A1* | 1/2014 | Morris, III | ............ | B81B 7/0041 257/415 |
| 2016/0130137 A1* | 5/2016 | Huang | ..................... | B81B 7/02 257/415 |
| 2017/0073218 A1* | 3/2017 | Kaanta | ................. | B81B 7/0048 |

* cited by examiner

STRUCTURES FOR REDUCING AND PREVENTING STRESS AND TENSIONS DURING PROCESSING OF SILICON WITH THE AID OF MELTING BY A LASER

CROSS REFERENCE

The present application claims the benefit under 35 U.S.C. § 119 of German Patent Application No. 102015220893.1 filed on Oct. 26, 2015, which is expressly incorporated herein by reference in its entirety.

BACKGROUND INFORMATION

In a method described in PCT Application No. WO 2015/120939 A1, if a certain internal pressure is desired in a cavity of a micromechanical component, or if a gas mixture with a certain chemical composition is to be enclosed in the cavity, then the internal pressure or the chemical composition is frequently adjusted during capping of the micromechanical component or during the bonding process between a substrate wafer and a cap wafer. During capping, for example, a cap is connected to a substrate, whereby the cap and the substrate together surround the cavity. By adjusting the atmosphere or the pressure and/or the chemical composition of the gas mixture present in the surroundings during capping, the certain internal pressure and/or the certain chemical composition may thus be adjusted in the cavity.

Using the method described in PCT Application No. WO 2015/120939 A1, an internal pressure may be adjusted in a targeted way in a cavity of a micromechanical component. Using this method, it is particularly possible to manufacture a micromechanical component with a first cavity, a first pressure and a first chemical composition being adjustable in a first cavity, which differs from a second pressure and a second chemical composition at the point in time of the capping.

In the method for targeted adjusting of an internal pressure in a cavity of a micromechanical component as described in PCT Application No. WO 2015/120939 A1, a small access channel to the cavity is generated in the cap or in the cap wafer or in the substrate or in the sensor wafer. The cavity is subsequently flooded with the desired gas and the desired internal pressure via the access channel. Finally, the area around the access channel is locally heated with the aid of a laser, the substrate material liquefies locally, and hermetically seals the access channel during solidification.

SUMMARY

It is an object of the present invention to provide a method for manufacturing a mechanically robust micromechanical component with a long service life compared to the related art in a simple and cost efficient way with respect to the related art. Furthermore, it is the object of the present invention to provide a compact, mechanically robust micromechanical component with a long service life compared to the related art. According to the present invention, this applies in particular for a micromechanical component including one (first) cavity. Using the method according to the present invention and the micromechanical component according to the present invention, it is additionally also possible to implement a micromechanical component in which a first pressure and a first chemical composition may be adjusted in the first cavity, and a second pressure and a second chemical composition may be adjusted in a second cavity. For example, a method of this type is provided for manufacturing micromechanical components for which it is advantageous if a first pressure is enclosed in a first cavity and a second pressure in a second cavity, whereby the first pressure is to be different from the second pressure. This is then, for example, the case when a first sensor unit for measuring rotation rate and a second sensor unit for measuring acceleration are to be integrated into one micromechanical component.

The object may be achieved in accordance with the present invention, for example, in a fourth method step, a recess is formed in a surface of the substrate or of the cap facing away from the first cavity in the area of the access opening for reducing local stresses occurring at a sealed access opening.

Thus, in a simple and cost-efficient way, a method is provided for manufacturing a micromechanical component, with which local stresses occurring in the area of the access opening may be reduced and distributed. Furthermore, using the method according to the present invention, it is possible to significantly reduce or to prevent conventionally occurring stress peaks. In particular, it is possible with the aid of the recess to reduce mechanical stresses through elastic deformation. Compared to a method without formation of the recess, the method according to the present invention has the advantage, for example, that a material area solidified after the third method step and/or the interfaces between the solidified material area and the remaining substrate or the remaining cap and/or the area around the interfaces are less susceptible to crack formations, since locally occurring stresses are effectively reduced with the aid of the recess or may be distributed across a larger material area.

Thus, it is less critical, due to the method according to the present invention, if there is unintentional contact of the solidified material area during the manufacturing flow, since the solidified material area is less likely to be the cause or originating point for cracks due to the reduced local stresses. Using the method according to the present invention, it is also less problematic if the substrate material is only locally heated and the heated material shrinks together both during solidification as well as during cooling relative to its surroundings. The fact that a very large tensile stress may thus be generated in the sealing area is also less problematic, since an additionally occurring mechanical stress, which is necessary to lead to a component failure, is substantially higher than for conventional methods due to the reduction of local mechanical stresses. Thus, spontaneously occurring crack formation is also less probable, depending on the stress and the material. Crack formation under thermal or mechanical load of the micromechanical component during further processing or in the field is also less probable, since the mechanical stress or pretension present in the micromechanical component is substantially lower than in micromechanical components manufactured using already known methods. In particular, it is less critical, when using the method according to the present invention, if a point or a protrusion of the point beyond the surface of the substrate or the cap forms in the center of the melted zone or in the center of the solidified material area during solidification of the material area due to the recrystallization dynamic. The probability of damage to such a point or negative effects due to an unintentional contact of the point, for example, during the further manufacturing flow, may be effectively reduced by using the recess. Thus, the method according to the present invention is an effective possibility for reducing the probability that the solidified material area or the point is the cause or the originating point for cracks. Thus, a method for manufacturing a mechanically robust micromechanical component having a long service life in a simple and cost-efficient way is provided with respect to the related art.

In connection with the present invention, the term "micromechanical component" is to be understood in that the term includes micromechanical components as well as microelectromechanical components.

The present invention is provided preferably for the manufacturing of or for a micromechanical component with a cavity. However, the present invention is also provided, for example, for a micromechanical component with two cavities or with more than two, i.e., three, four, five, six, or more than six cavities.

The access opening is preferably sealed by the introduction of energy and heat into a part of the substrate or the cap absorbing this energy and this heat with the aid of a laser. Energy and heat is hereby preferably introduced chronologically in series in the respective absorbing part of the substrate or of the cap of multiple micromechanical components, which are collectively manufactured on a wafer. However, a chronologically parallel introduction of the energy and heat into the respective absorbing part of the substrate or the cap of multiple micromechanical components is alternatively provided, for example, by using multiple laser beams or laser devices.

Advantageous embodiments and refinements of the present invention are described herein with reference to the figures.

According to one preferred refinement, it is provided that the cap together with the substrate encloses a second cavity, a second pressure prevailing and a second gas mixture with a second chemical composition being enclosed in the second cavity.

In accordance with another embodiment of the present invention, a method is provided for manufacturing a micromechanical component including a substrate and a cap connected to the substrate and enclosing together with the substrate a first cavity and a second cavity, a first pressure prevailing and a first gas mixture with a first chemical composition being enclosed in the first cavity, a second pressure prevailing and a second gas mixture with a second chemical composition being enclosed in the second cavity:
- in a first method step, an access opening connecting the first cavity to surroundings of the micromechanical component being formed in the substrate or in the cap;
- in a second method step, the first pressure and/or the first chemical composition being adjusted in the first cavity;
- in a third method step, the access opening being sealed by introducing energy and heat into an absorbing part of the substrate or the cap with the aid of a laser;
- in a fourth method step, a recess being formed in a surface of the substrate or of the cap facing away from the first cavity in the area of the access opening for reducing local stresses occurring at a sealed access opening.

According to one preferred refinement, it is provided that the recess is formed in such a way that a first surface of a projection of the recess onto a plane extending essentially in parallel to the surface and a second surface of a projection of the absorbing part of the substrate or the cap onto the plane do not or at least only partially overlap. This achieves in an advantageous way that, in the case that no overlap of the two surfaces is present, no molten material flows into the recess or the recesses, and thus the recess may be designed particularly accurately for the reduction of mechanical stresses. Alternatively, in the case of an overlapping of the two surfaces, it is advantageously made possible that the recess, in addition to dissipating mechanical stresses, is also provided for accommodating a material area converted into a liquid aggregate state in the third method step. Thus, for example, the solidified material area may be lowered at least partially with respect to the surface in comparison to a conventional method without using a recess.

According to one preferred refinement, it is provided that in the fourth method step, an additional recess or a plurality of additional recesses are formed in the surface in the area of the access opening to reduce local stresses occurring at a sealed access opening. Thus, it is advantageously made possible that the reduction of occurring local stresses may be adjusted particularly accurately.

According to one preferred refinement, it is provided that the recess and/or the additional recess and/or a plurality of additional recesses are formed in a plane extending essentially in parallel to the surface essentially rotationally symmetrical with respect to the access channel or to the absorbing part of the substrate or of the cap, in particular, with respect to the center of mass of the absorbing part of the substrate or of the cap. Thus, a particularly symmetrical reduction of mechanical stresses is made possible in an advantageous way.

According to one preferred refinement, it is provided that the recess and/or the additional recess and/or the plurality of additional recesses are etched anisotropically into the surface, in particular, the recess and/or the additional recess and/or the plurality of additional recesses being etched isotropically after the anisotropic etching. Thus, it is advantageously made possible to provide that the recess and/or the additional recess and/or the plurality of additional recesses may be formed to be anisotropic or oblong, in the sense of a larger extension of the recess being essentially perpendicular to the surface than in parallel to the surface or in the sense of a smaller extension of the recess being essentially perpendicular to the surface than in parallel to the surface. Furthermore, it is additionally advantageously made possible that the recess includes an isotropic and an anisotropic area.

According to one preferred refinement, it is provided that the recess and/or the additional recess and/or the plurality of additional recesses are formed in such a way that a first extension of the recess and/or the additional recess and/or the plurality of additional recesses generally perpendicular to the surface corresponds essentially to a second extension of the absorbing part of the substrate or of the cap. Thus, it is advantageously made possible that the mechanical stresses may be reduced in particular across the entire area of the absorbing part of the substrate or of the cap or across the entire area of the solidified material area.

According to one preferred refinement, it is provided that the fourth method step is carried out chronologically after the first method step. Thus, it is advantageously made possible that the recess or the recesses or the structures are introduced into the cap surface after the generation of the access channel.

According to one preferred refinement, it is provided that the fourth method step is carried out in particular chronologically before the second method step. Thus, it is advantageously made possible that the recess or the recesses or the structures are introduced before adjusting the first pressure and/or the first chemical composition.

According to one preferred refinement, it is provided that the recess and/or the additional recess and/or the plurality of additional recesses are formed in such a way that, chronologically after the third method step, the recess and/or the additional recess and/or the plurality of additional recesses include a ring-shaped cavity or a plurality of ring-shaped cavities. Thus, it is advantageously made possible that mechanical stresses may be reduced in particular also underneath the area of the absorbing part of the substrate or of the cap or underneath the entire solidified material area: underneath in the sense of in the direction away from the surface or in the direction toward the first cavity.

In addition, another subject matter of the present invention is a micromechanical element including a substrate and a cap connected to the substrate and enclosing together with the substrate a first cavity, a first pressure prevailing and a first gas mixture with a first chemical composition being enclosed in the first cavity, the substrate or the cap including a sealed access opening, the substrate or the cap including: a recess situated in a surface of the substrate or of the cap facing away from the first cavity in the area of the access opening for reducing local stresses occurring at a sealed access opening.

According to a preferred refinement, it is provided that the cap together with the substrate encloses a second cavity, a second pressure prevailing and a second gas mixture with a second chemical composition being enclosed in the second cavity.

Furthermore, another subject matter of the present invention is a micromechanical element including a substrate and a cap connected to the substrate and together with the substrate encloses a first cavity and a second cavity, a first pressure prevailing and a first gas mixture with a first chemical composition being enclosed in the first cavity, a second pressure prevailing and a second gas mixture with a second chemical composition being enclosed in the second cavity, the substrate or the cap includes a sealed access opening, the substrate or the cap including: a recess situated in a surface of the substrate or of the cap facing away from the first cavity in the area of the access opening for reducing local stresses occurring at a sealed access opening. Thus, a compact, mechanically robust, and cost-efficient micromechanical component is provided in an advantageous way with adjusted first pressure and second pressure. The mentioned advantages of the method according to the present invention may correspondingly also apply for the micromechanical component according to the present invention.

According to one preferred refinement, it is provided that the substrate or the cap includes an additional recess or preferably a plurality of additional recesses in the surface in the area of the access opening to reduce local stresses occurring at a sealed access opening. Thus, a micromechanical component is provided, with which it is advantageously made possible that the reduction of occurring local stresses may be adjusted particularly accurately.

According to one preferred refinement, it is provided that the substrate and/or the cap include silicon. It is thus made possible that the micromechanical component may be manufactured using standardized methods of layer technology.

According to one preferred refinement, it is provided that the first pressure is lower than the second pressure, a first sensor unit for measuring the rotation rate being situated in the first cavity and a second sensor unit for measuring the acceleration being situated in the second cavity. Thus, a mechanically robust micromechanical component for measuring the rotation rate and the acceleration is provided with optimum operating conditions both for the first sensor unit and for the second sensor unit.

DETAILED DESCRIPTION OF EXAMPLE EMBODIMENTS

Figure 1:
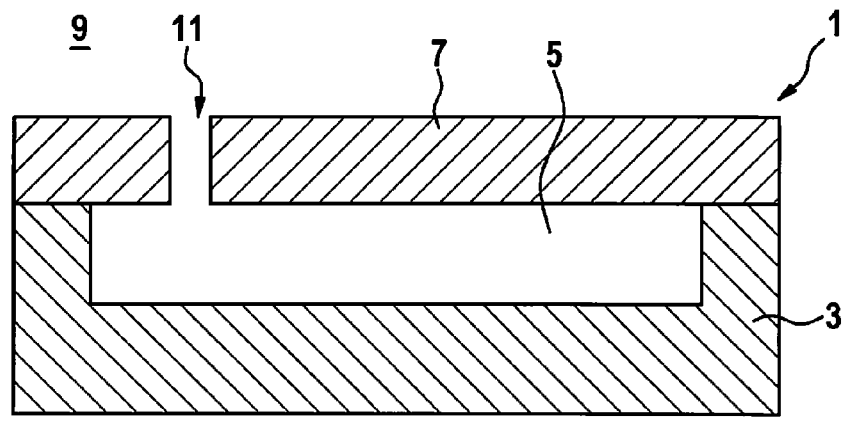
FIG. 1 shows a micromechanical component including an open access opening according to one exemplary specific embodiment of the present invention in a schematic representation.

In the different figures, identical parts are provided with identical reference numerals and are therefore generally also only named or mentioned once.

Figure 2:
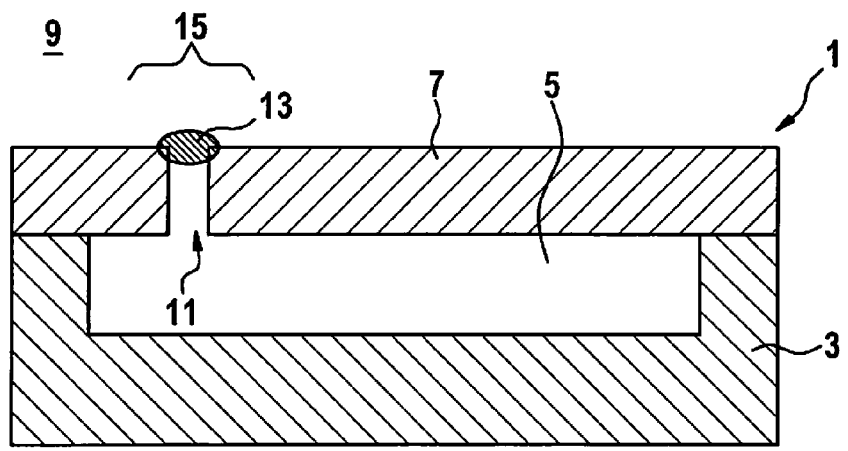
FIG. 2 shows the micromechanical component according to FIG. 1 including a sealed access opening in a schematic representation.

FIG. 1 and FIG. 2 show a schematic depiction of a micromechanical component 1 including an open access opening 11 in FIG. 1, and including a sealed access opening 11 in FIG. 2 according to one exemplary specific embodiment of the present invention. Micromechanical component 1 hereby includes a substrate 3 and a cap 7. Substrate 3 and cap 7 are connected to one another, preferably hermetically, and together enclose a first cavity 5. For example, micromechanical component 1 is formed in such a way that substrate 3 and cap 7 additionally together enclose a second cavity. The second cavity is, however, not shown in FIG. 1 and FIG. 2.

For example, a first pressure prevails in first cavity 5, in particular in the case of sealed access opening 11, as shown in FIG. 2. In addition, a first gas mixture with a first chemical composition is enclosed in first cavity 5. Furthermore, for example, a second pressure prevails in the second cavity and a second gas mixture with a second chemical composition is enclosed in the second cavity. Access opening 11 is preferably situated in substrate 3 or in cap 7. In the case of the exemplary embodiment presented here, access opening 11 is situated for example in cap 7. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for measuring the rotation rate is situated in first cavity 5, not shown in FIG. 1 and FIG. 2, and a second micromechanical sensor unit for measuring the acceleration is situated in the second cavity, not shown in FIG. 1 and FIG. 2.

Figure 3:
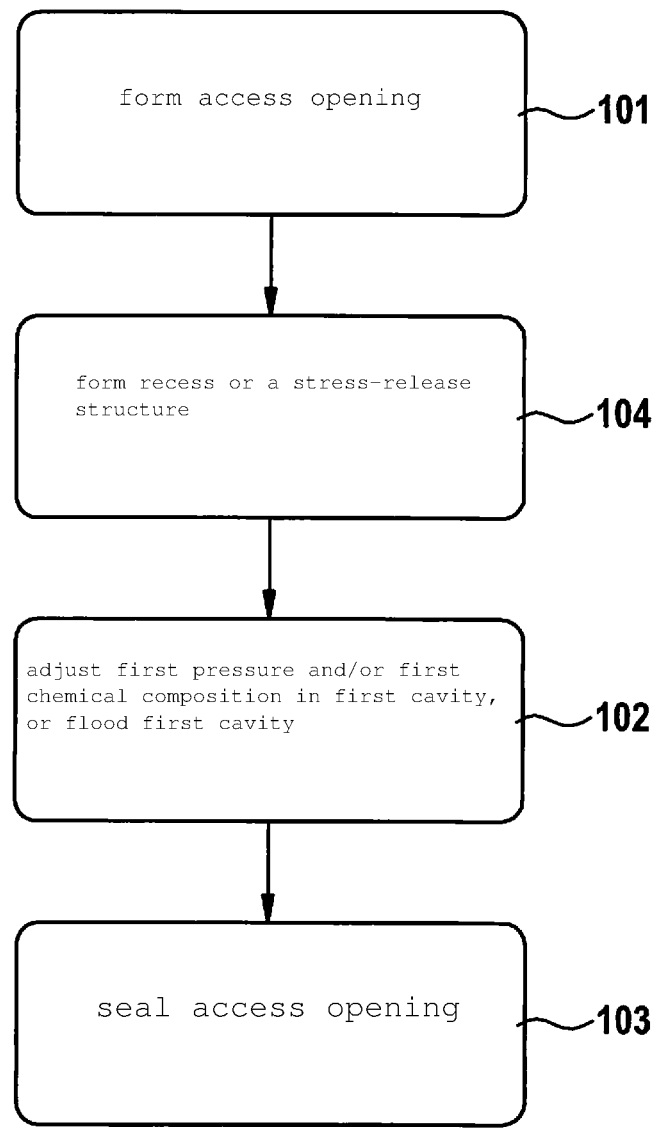
FIG. 3 shows a method for manufacturing a micromechanical component according to one exemplary specific embodiment of the present invention in a schematic representation.

A method for manufacturing micromechanical component 1 according to an exemplary specific embodiment of the present invention is shown in a schematic representation in FIG. 3. For this purpose, in a first method step 101, in particular, narrow access opening 11 in substrate 3 or in cap 7 is formed connecting first cavity 5 to surroundings 9 of micromechanical component 1. FIG. 1 shows, for example, micromechanical component 1 after first method step 101. In addition, in a second method step 102, the first pressure and/or the first chemical composition is adjusted in first cavity 5, or first cavity 5 is flooded with the desired gas and the desired internal pressure via the access channel. Furthermore, for example, in a third method step 103, access opening 11 is sealed by introducing energy and heat into an absorbing part 21 of substrate 3 or cap 7 with the aid of a laser. It is, for example, alternatively also provided that in third method step 103, the area around the access channel is merely preferably locally heated by a laser and the access channel is hermetically sealed. Thus, it is advantageously possible to also provide the method according to the present invention with other energy sources besides a laser for sealing access opening 11. FIG. 2 shows, for example, micromechanical component 1 after third method step 103.

Chronologically after third method step 103, mechanical stresses may occur in a lateral area 15, shown, for example, in FIG. 2, on surface 19, and in the depth perpendicular to a projection of lateral area 15 onto surface 19, i.e. along access opening 11 and in the direction of first cavity 5 of micromechanical component 1. These mechanical stresses, in particular local mechanical stresses, prevail in particular on or in the vicinity of an interface between a material area 13 of cap 7, which seals access opening 11 in a liquid aggregate state in third method step 103 and transitions into a solid aggregate state after third method step 103, and a residual area of cap 7, which remains in a solid aggregate state during third method step 103. In FIG. 2, material area 13 of cap 7 sealing access opening 11 is hereby merely indicated schematically or schematically depicted, in particular with respect to its lateral extension or form extending in particular in parallel to surface 19, and in particular with respect to its expansion or configuration running perpendicular to the lateral extension, in particular perpendicular to surface 19.

Figure 7:
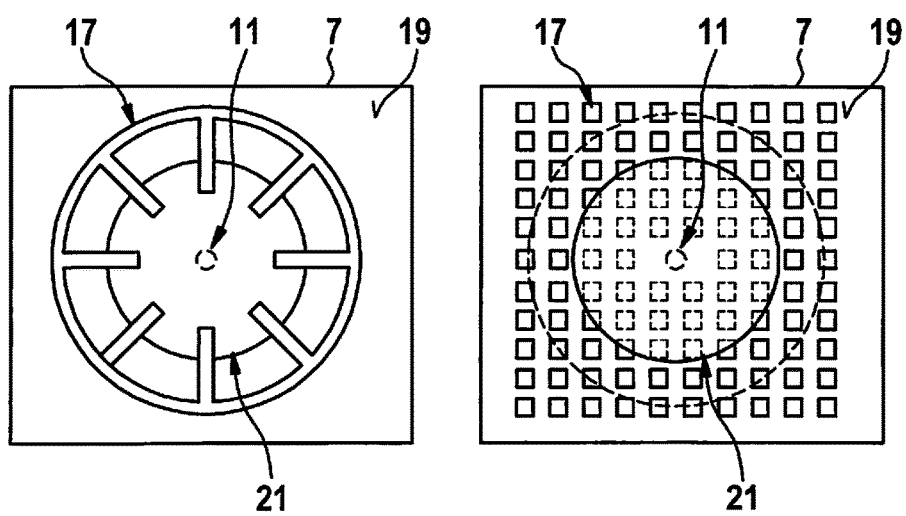
Figure 8:
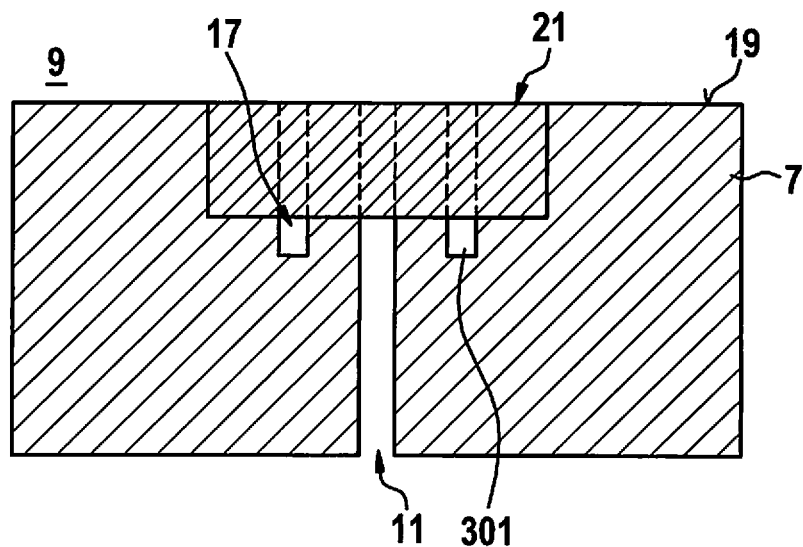
Figure 9:
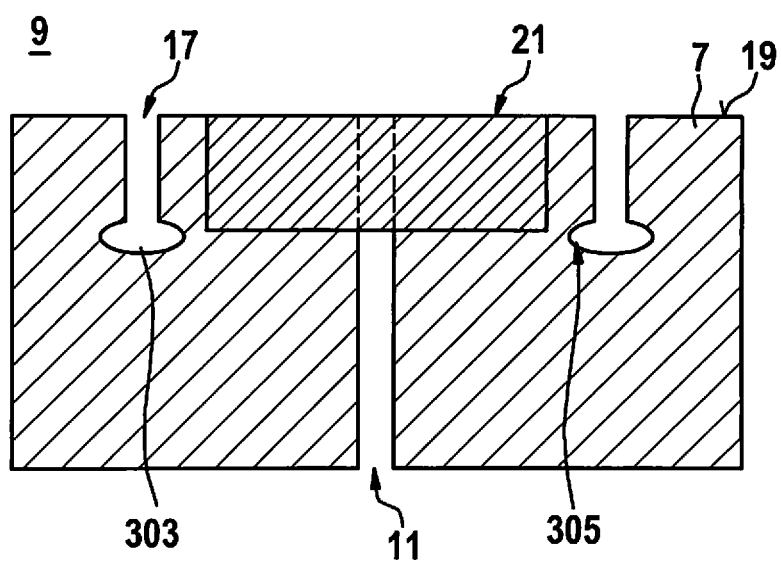

In FIG. 4, FIG. 5, FIG. 6, FIG. 7, FIG. 8, and FIG. 9, subareas of a micromechanical component 1 according to exemplary specific embodiments of the present invention are schematically depicted. In FIG. 4, FIG. 5, FIG. 6, FIG. 7, FIG. 8, and FIG. 9, different recesses 17 or structures are hereby situated for reducing the stresses in or around absorbing part 21 of substrate 3 or of cap 7 or in or around the area which is melted. The structures are hereby formed in such a way that the material directly around absorbing part 21 of substrate 3 or of cap 7 or around molten area 21 may reduce the stresses in the solidified melting area due to elastic deformation. For this purpose, for example, one single structure or also a plurality of structures is situated preferably rotationally symmetrical with respect to the center of mass of the melt. In FIG. 4, FIG. 5, FIG. 6, FIG. 7, FIG. 8, and FIG. 9, for example, recesses 17 or structures are provided. However, differently shaped and differently extending recesses 17 may also be provided which meet the objective according to the present invention. The structures provided in FIG. 4, FIG. 5, FIG. 6, FIG. 7, FIG. 8, and FIG. 9 are preferably etched anisotropically into surface 19. In addition, for example, a lower part of the structures shown in FIG. 9 is isotropically etched after the anisotropic etching. For example, surface 19 hereby includes a silicon surface. For example, a first extension of recesses 17 is perpendicular to surface 19, or the depth, to which recesses 17 of the structures extend into surface 19 or into the silicon surface, is in the area of a second extension of absorbing part 21, perpendicular to surface 19 or to the melting depth, for example, of the silicon. However, it is alternatively also provided that the first extension is smaller than the second extension. Alternatively, it is additionally also provided that the second extension is smaller than the first extension.

FIG. 3 shows by way of example that, in a fourth method step 104, recess 17 or a stress-release structure is formed in a surface 19 of substrate 3 or of cap 7 facing away from first cavity 5 in the area of access opening 11 to reduce local stresses occurring at a sealed access opening 11.

Figure 4:
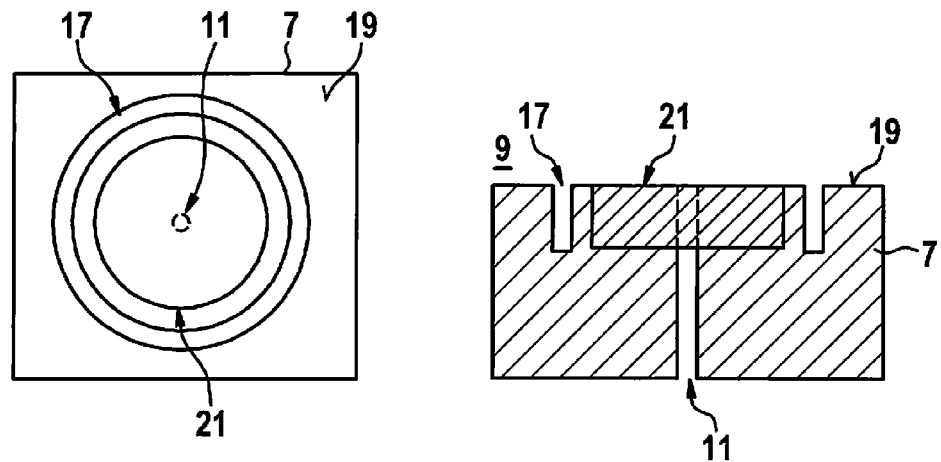
FIG. 4, FIG. 5, FIG. 6, FIG. 7, FIG. 8, and FIG. 9 show subareas of a micromechanical component according to exemplary specific embodiments of the present invention in schematic representations.
Figure 5:
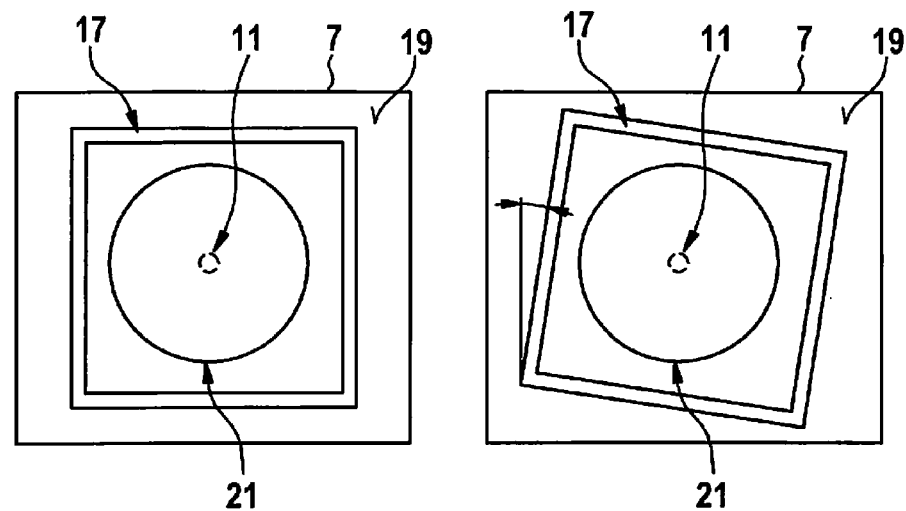

In FIG. 4 and FIG. 5, different recesses 17 or structures or ring-shaped structures for reducing stresses are depicted. For example, a distance of a recess 17 to the outer edge of absorbing part 21 of substrate 3 or of cap 7 hereby corresponds maximally to the radius of absorbing part 21 or of melting area 21. In particular, it is provided, for example, that the distance of recess 17 to the outer edge of absorbing part 21 of substrate 3 or of cap 7 corresponds to half of the radius of absorbing part 21 or of melting area 21. Furthermore, it is provided, for example, that recess 17 is formed as a circular ring, as a square frame, or as a polygon, in particular as a quadrilateral, hexagon, octagon, decagon, or dodecagon, or as a polygon with more than twelve sides. For example, the square frame or the polygon may also be aligned arbitrarily according to the crystal orientation, in particular according to the silicon crystal orientation, and/or formed as an additional polygon.

Figure 6:
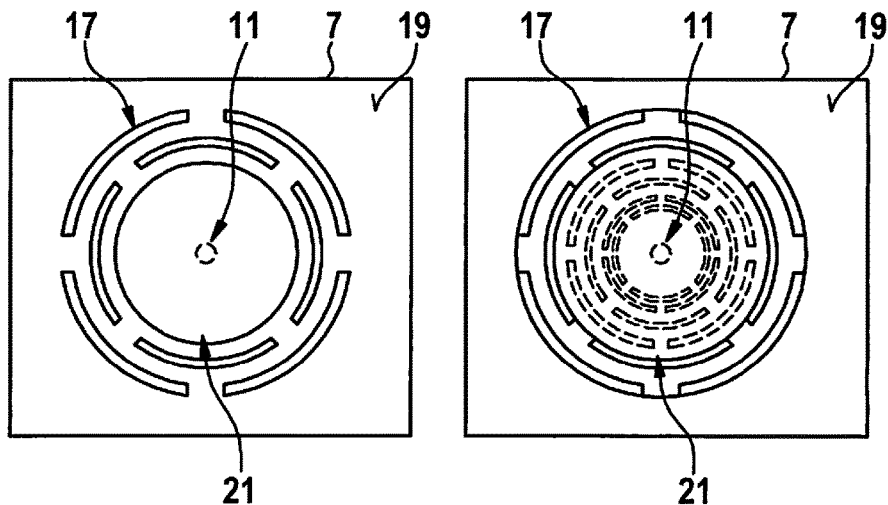

In FIG. 6, two additional possible designs of recess 17 are shown by way of example. In particular, a plurality of recesses 17 is shown in FIG. 6. For example, recess 17 or the plurality of recesses 17 or the stress-release structure for adjusting the mechanical properties include one or multiple nested, interrupted ring structures. These ring structures, for example, do not intersect or intersect at least partially with melting area 21 or with absorbing part 21 or extend into melting area 21 or into absorbing part 21.

In FIG. 7, two additional possible designs of recess 17 are shown by way of example. For example, in this case, recess 17 includes a ring structure running around melting area 21 or absorbing part 21 and trenches connected to the ring structure and running in a spoke-like fashion or radially to the center or to the center of mass of melting area 21. The trenches hereby extend, for example, merely partially into absorbing part 21 and are situated at least partially outside of absorbing part 21. It is also provided, for example, that the trenches are formed to be connected to one another in the area of access opening 11. In other words, the trenches may meet in the center or preferably end prior to that. For example, it is to be further ensured, taking into account all tolerances, that the ends lie within melting area 21. Furthermore, an additional possible design of a plurality of additional recesses 17 is shown in FIG. 7. A plurality of individual structures 17 are hereby situated in and around melting area 21, which make the material more flexible and tolerant for adjustment offsets due to the matrix-like arrangement. It is provided, for example, that individual structures 17 are formed from quadrilaterals, hexagons, or octagons, or a combination of the same.

FIG. 8 shows by way of example an additional possible design of recess 17. Recess 17 hereby includes, for example, a ring-shaped structure or multiple individual structures formed with ring shapes and situated within melting area 21 around access channel 11. The depth of recess 17 or the structure or the extension of recess 17 perpendicular to surface 19 is hereby greater than the extension of absorbing part 21 or of the melting depth. It is thus possible that after a material area solidified in the area of absorbing part 21, after the melting of the material area, a ring-shaped cavity 301 or multiple ring-shaped cavities 301 situated around access channel 11 is/are formed and remain underneath the melt symmetrically around access channel 11. Due to these cavities 301, stress or mechanical stress in the area of the underside of the access hole seal or on a side of absorbing part 21 facing first cavity 5 may be reduced. For example, the width or an extension of recess 17 is hereby formed in such a way that, for example, the laser in third method step 103 does not reach the etching base or an interface between recess 17 and cap 7, or that the laser does not irradiate the etching base or the interface. Alternatively, it is also provided that the angle of incidence of the laser beam in third method step 103 is set in such a way that the laser beam or the laser pulse does not perpendicularly strike the recess surface or the interface between recess 17 and cap 7.

It is provided according to the present invention that, for example, recesses 17 or structures are optionally combined with stress release structures or additional recesses 17 or structures outside of melting area 21 or absorbing part 21. Different etching depths may hereby be implemented, for example, with the aid of the aspect ratio dependent etch (rate) (ARDE) effect.

Finally, FIG. 9 shows recesses 17, the recesses 17 each including an isotropic area 303. It is hereby provided, for example, that isotropic area 303 is situated in particular on a side of recess 17 facing away from surface 19. For example, recesses 17 or the structures shown in FIG. 9 are etched in such a way that, at the end of the etching or on a side of recess 17 facing first cavity 5, an isotropic etching step is carried out, due to which an undercut 305 is formed at the etching base. It is provided, in particular, that undercut 305 is formed in such a way that undercut 305 extends essentially in parallel to surface 19 or, in comparison to remaining recess 17, projects at least partially into cap 7 in parallel to the surface.

What is claimed is:

1. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:
   in a first step, forming an access opening connecting the first cavity to surroundings of the micromechanical component in the substrate or in the cap;
   in a second step, adjusting at least one of the first pressure and the first chemical composition in the first cavity;
   in a third step, sealing the access opening by introducing energy and heat into an absorbing part of the substrate or the cap with the aid of a laser; and
   in a fourth step, forming a recess in a surface of the substrate or of the cap facing away from the first cavity by isotropically etched into the surface after anisotropic etching in an area of the access opening for reducing local stresses occurring at the sealed access opening, wherein a distance from the area to the absorbing part is equal to at most a radius of the absorbing part, wherein the recess is not situated within the absorbing part.

2. The method as recited in claim 1, wherein the cap together with the substrate encloses a second cavity, a second pressure prevailing and a second gas mixture with a second chemical composition being enclosed in the second cavity.

3. The method as recited in claim 1, wherein in the fourth step, an additional recess or a plurality of additional recesses are formed in the surface in the area of the access opening to reduce local stresses occurring at the sealed access opening.

4. The method as recited in claim 1, wherein at least one of the recess, an additional recess, and a plurality of additional recesses is formed in a plane extending in parallel to the surface which is rotationally symmetrical to the access opening or to the absorbing part of the substrate or of the cap.

5. The method as recited in claim 4, wherein the at least one of the recess, the additional recess, and the plurality of additional recesses are formed in such a way that a first extension of the at least one of the recess, the additional recess, and the plurality of additional recesses perpendicular to the surface corresponds to a second extension of the absorbing part of the substrate or of the cap.

6. The method as recited in claim 4, wherein the at least one of the recess, the additional recess, and the plurality of additional recesses, are formed chronologically after the third step, so that the at least one of the recess, the additional recess, and the plurality of additional recesses includes a ring-shaped cavity or a plurality of ring-shaped cavities.

7. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:
   in a first step, forming an access opening connecting the first cavity to surroundings of the micromechanical component in the substrate or in the cap;
   in a second step, adjusting at least one of the first pressure and the first chemical composition in the first cavity;
   in a third step, sealing the access opening by introducing energy and heat into an absorbing part of the substrate or the cap with the aid of a laser; and
   in a fourth step, forming a recess in a surface of the substrate or of the cap facing away from the first cavity in an area of the access opening for reducing local stresses occurring at the sealed access opening,
   wherein at least one of the recess, an additional recess, and a plurality of additional recesses is formed in a plane extending in parallel to the surface which is rotationally symmetrical to the access opening or to the absorbing part of the substrate or of the cap,
   wherein the at least one of the recess, the additional recess, and the plurality of additional recesses is formed rotationally symmetrical to a center of mass of the absorbing part of the substrate or of the cap.

* * * * *